United States Patent [19]
White et al.

[11] Patent Number: 5,228,208
[45] Date of Patent: Jul. 20, 1993

[54] METHOD OF AND APPARATUS FOR CONTROLLING THERMAL GRADIENT IN A LOAD LOCK CHAMBER

[75] Inventors: Gregory W. White, Cupertino; Glenn D. Alexander, San Jose, both of Calif.

[73] Assignee: Applied Materials, Inc., Santa Clara, Calif.

[21] Appl. No.: 921,463

[22] Filed: Jul. 28, 1992

Related U.S. Application Data

[63] Continuation of Ser. No. 715,984, Jun. 17, 1991, abandoned.

[51] Int. Cl.⁵ .................................................. F26B 5/04
[52] U.S. Cl. .......................................... 34/15; 34/34; 34/218
[58] Field of Search .................... 34/15, 20, 22, 34, 36, 34/37, 92, 218, 235

[56] References Cited

U.S. PATENT DOCUMENTS

| | | | |
|---|---|---|---|
| 3,918,169 | 11/1975 | De Smet | 34/15 |
| 3,983,637 | 10/1976 | Johnson | 34/15 |
| 4,115,596 | 9/1978 | Knutrud | 34/15 X |
| 4,187,616 | 2/1980 | Yamada et al. | 34/15 X |
| 4,512,391 | 4/1985 | Harra | 165/48.1 |
| 4,611,469 | 9/1986 | Musschoot | 34/15 X |
| 4,724,621 | 2/1988 | Hobson et al. | 34/218 |
| 4,768,291 | 9/1988 | Palmer | 34/218 |

Primary Examiner—Stephen M. Hepperle
Attorney, Agent, or Firm—Keiichi Nishimura

[57] ABSTRACT

After a heated object such as a processed wafer is placed inside a load lock chamber in a vacuum condition, a specified limited amount of vent gas is introduced and the pressure inside the chamber is maintained at an intermediate level for a specified length of time so a to control its thermal gradient. After the specified length of time, the chamber is completely vented. Both software and hardware implementations are possible for this staged vent.

26 Claims, 2 Drawing Sheets

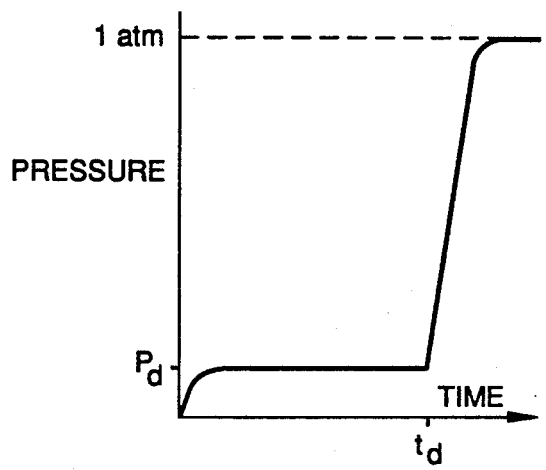
FIG._1
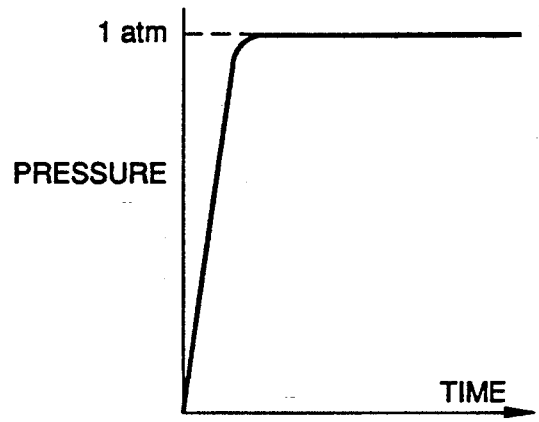
FIG._2
(PRIOR ART)
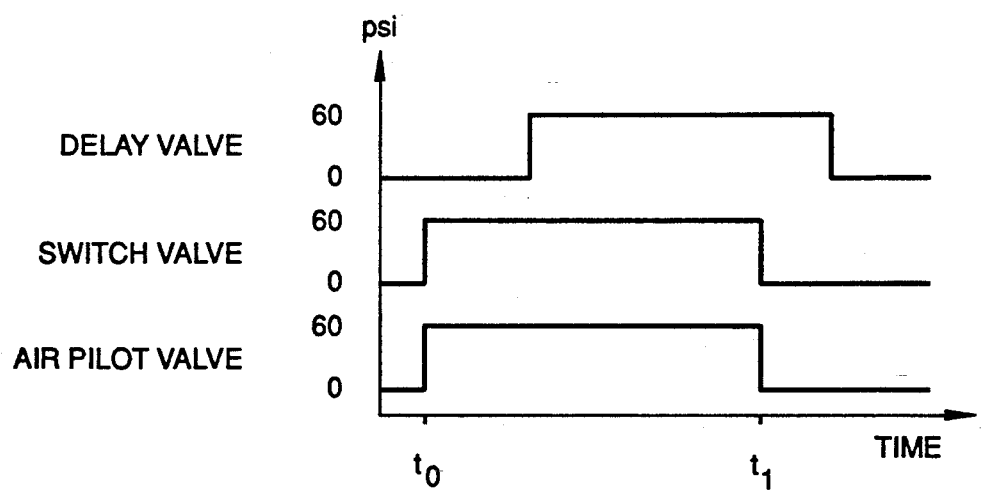
FIG._5

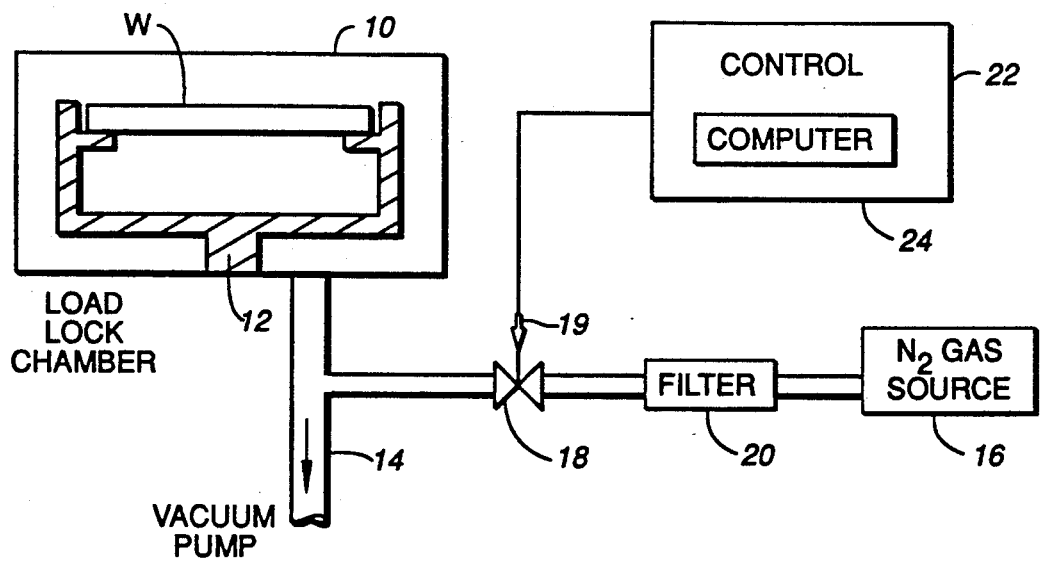
*FIG._3*
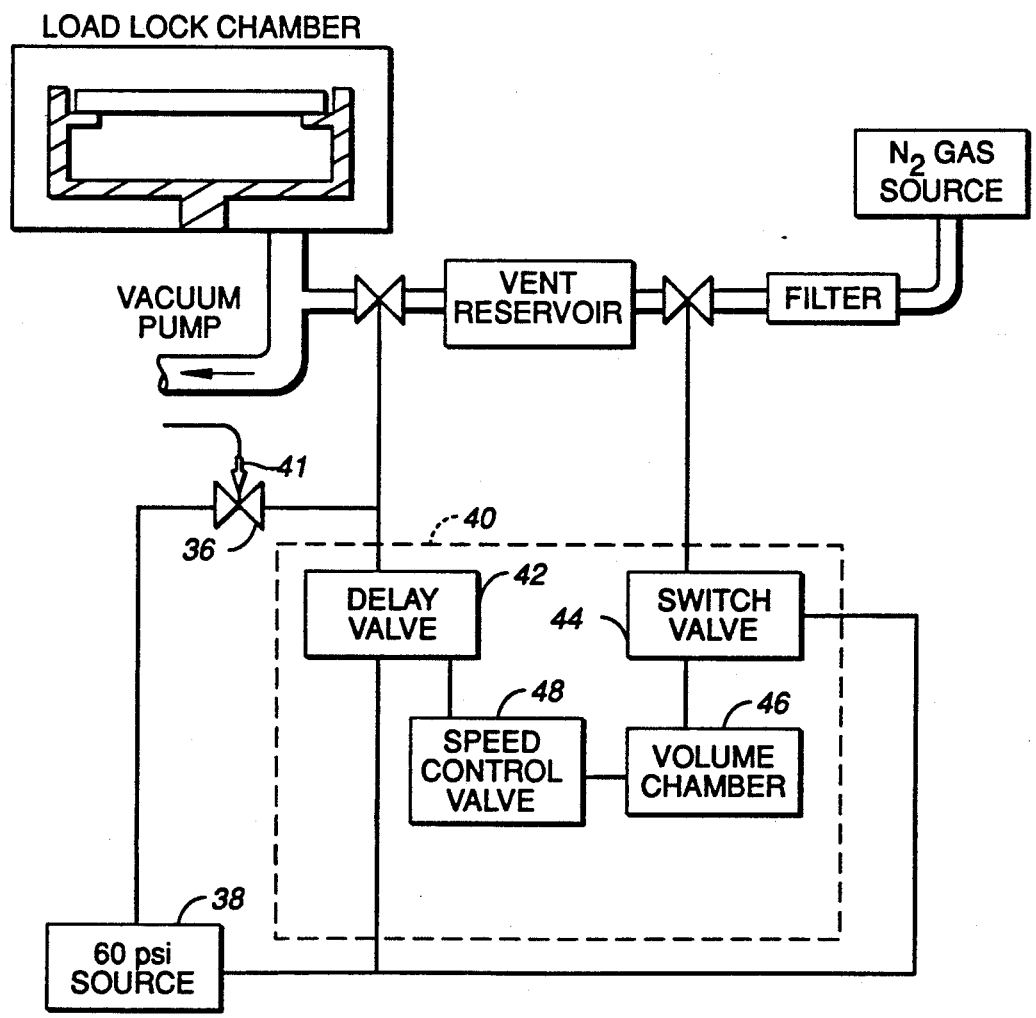
*FIG._4*

METHOD OF AND APPARATUS FOR CONTROLLING THERMAL GRADIENT IN A LOAD LOCK CHAMBER

This is a continuation of U.S. application Ser. No. 07/715,984 filed Jun. 17, 1991 now abandoned.

BACKGROUND OF THE INVENTION

This invention relates to a method of and apparatus for controlling the thermal gradient which develops when, for example, a vent gas is introduced into a load lock chamber containing a heated object.

Consider, for example, a work station in a wafer processing system for the production of memory devices. Such a work station may typically be provided with a load lock chamber, and silicon wafers which are brought one by one out of a chemical vapor deposition chamber are passed through this load lock chamber before they are transferred out, say, by a storage elevator. The wafer removed from a chemical vapor deposition chamber may be about 360° C., and the wafers do not cool appreciably on the storage elevator if it is kept in a vacuum condition. Since the wafers are brittle and easily damaged, they are supported only by peripheral surface areas. In vacuum, conduction of heat to the storage elevator relies on intimate contact between the wafer and the elevator. If the wafer surface contour does not exactly match the planar surface contour of the storage elevator, the contact between the surfaces is poor and hence the conductivity is low. Even if the contours match, surface roughness and lightness of the wafer minimize its contact with the elevator surface.

If the load lock chamber is vented, the wafers suddenly begin to cool. The vent gas conducts heat from the wafer to the storage elevator, cooling off the parts of the wafer that are in contact with the storage elevator, while the other part of the wafer loses heat only by transverse conduction through the silicon. This results in a large thermal gradient in the wafer. This is believed to be the cause of large numbers of wafers broken in the storage elevator. The parts of the wafer in contact with the storage elevator contract as they cool, while the other non-contacting part does not. This differential cooling results in a tensile load in the cool part and a corresponding compressive load in the hot part. These loads in combination can either buckle or shear the wafer, depending on the orientation of the gradient.

SUMMARY OF THE INVENTION

It is therefore an object of the present invention to provide a method of and apparatus for controlling thermal gradient in a high-temperature silicon wafer or the like supported inside a load lock chamber.

According to a method embodying the present invention, by which the above and other objects may be accomplished, a heated object is placed inside a sealed load lock chamber in a vacuum condition and the chamber is then vented in two stages rather than all at once. Initially, a specified limited amount of a gas is introduced such that the pressure inside the chamber reaches a preselected intermediate level such as 10 torr and the chamber is kept in this condition for a preselected length of time. As explained above, the gas which is thus introduced into the load lock chamber has a cooling effect on the heated object but this effect is particularly strong where the object is supported by a holder because the holder is thermally conductive and the gas molecules have shorter distances to travel to conduct heat away from the heated object to the holder. If only a limited amount of the gas is introduced, the rate of cooling at the contacting parts of the object is less than if the load lock chamber is fully vented. Since the introduced gas hardly contributes to the cooling of the non-contacting part of the object, this means that the thermal gradient in the object is reduced because the rate of heat conduction to the holder at the contacting parts is reduced. Eventually, the chamber is totally vented at the end of this dwell time.

Both software and hardware implementations of such a staged venting process are possible. According to a software implementation of the method described above, a valve is provided between the chamber and a high-pressure source of the vent gas and a control mechanism, which may include a computer, is programmed to initially open the valve for a limited length of time, say, by outputting a pulse signal and to finally open the valve completely after an experimentally selected dwell time. A hardware implementation may include a vent reservoir and a pneumatic sequencer circuit. Initially, the vent gas inside the vent reservoir is introduced into the chamber to increase its interior pressure to the preselected intermediate level and the sequencer serves to fully vent the chamber by opening another valve connected to the vent gas source with a delay. Such a sequencer may be built with switch valves and a volume chamber much like an electrical delay circuit made of transistors and capacitors.

BRIEF DESCRIPTION OF THE DRAWINGS

FIG. 1 is a graph showing the time-rate of change in the pressure inside a load lock chamber which is vented by a method embodying the present invention;

FIG. 2 is a graph showing the time-rate of change in the pressure inside a load lock chamber which is vented by a prior art method;

FIG. 3 is a block diagram schematically showing an apparatus for venting a load lock chamber by a method according to the present invention;

FIG. 4 is a block diagram schematically showing another apparatus for venting a load lock chamber by a method according to the present invention; and FIG. 5 is a pressure diagram showing the pressure changes in the operation of the apparatus of FIG. 4.

DETAILED DESCRIPTION OF THE INVENTION

The present invention is based in part on the observation that the thermal conductivity of silicon is about 0.25 cal/sec·cm·°C. at 100° C. but less than half of this value at 400° C. Another observation on which this invention is based is that the radiation transmissivity of a bare 200 mm wafer, for example, is in excess of 85% at wavelength from 3 to 10 microns. This, coupled with the highly polished condition of the wafer surface or surfaces, means that the wafer is generally a poor emitter of infrared radiation. When a processed silicon wafer at high temperature is brought into a load lock chamber and placed on a holder, therefore, removal of heat from the wafer in this vacuum environment relies on its intimate contact with the holder. As explained in the Background, however, intimate contacts are unlikely to occur between the wafer and the holder.

If a vent gas is introduced into the load lock chamber, the gas molecules that contact the wafer and absorb heat therefrom are likely to strike the holder and to thereby transfer heat. In the peripheral regions of the wafer where it is supported by the holder, the molecules have shorter distances to travel in order to thus transfer heat from the wafer to the holder and also to return from the holder to the wafer surface. By contrast, the part of the wafer not in contact with the holder cannot lose heat efficiently both because the transverse conduction through the silicon is low and because the vent gas molecules have much farther to go before they can contact another surface to transfer heat. As a result, a high thermal gradient is developed inside the wafer, causing a stress inside the wafer and eventually its breakage. The present invention is based finally on the observation that this thermal gradient can be controlled by controlling the pressure (or the gas density) inside the load lock chamber.

According to the present invention, the load lock chamber is not vented all at once but in stages. Only a limited amount of vent gas (such as nitrogen) is initially introduced into the load lock chamber, and the interior of the load lock chamber is maintained at an intermediate pressure level (significantly lower than the final pressure level to which the interior of the load lock chamber will reach after it is completely vented) for a predetermined length of time (dwell time) before the load lock chamber is fully vented, say, to bring its interior pressure to 1 atm. Thus, the time-dependence of the interior pressure P may look schematically as shown in FIG. 1. This is to be contrasted with the graph in FIG. 2 which shows the change in pressure in a prior art mode of operating a load lock chamber under identical circumstances.

The purpose of thus keeping the interior of the load lock chamber in such a lower pressure level temporarily is to reduce the thermal gradient which will develop inside the wafer between where it contacts the thermoconductive holder and where it does not. Since the average speed of gas molecules drop as the gas pressure is reduced, the number of round-trips made by the vent gas molecules between the wafer and the holder is significantly reduced during this dwell time, and the temperature of the contacting parts of the wafer does not drop as quickly as if the load lock chamber is fully vented at once. As a result, the thermal gradient in the wafer is less steep, and the wafer is much less likely to break due to the thermal gradient.

The limited amount of gas to be introduced (and hence the aforementioned intermediate pressure level) and the length of dwell time are to be determined experimentally. A staged vent with a dwell time of 10 seconds at an intermediate pressure of 0.8 torr, for example, will halve the maximum gradient on a wafer cooled from 300° C. An excessively long dwell time will adversely affect the throughput. A throughput reduction caused by a 15-second dwell time, however, represents only about 0.78%, and, if the number of broken wafers is reduced by one per week, the dwell time may be considered adequately recouped. In FIG. 1, the intermediate pressure level and the dwell time are respectively represented as $P_d$ and $t_d$. (FIG. 1 is not intended to be quantitative but only schematic, and the level depicted in FIG. 1 is not intended to indicate a preferred intermediate pressure level.)

FIG. 3 shows an apparatus with which the method of the present invention described above can be practiced. In the block diagram of FIG. 3, numeral 10 indicates a load lock chamber with supporting means 12 for supporting thereon an object such as a wafer which is to be transferred into or out from a processing chamber (not shown). A storage means such as a storage elevator which connects to the load lock chamber 10 is similarly omitted from FIG. 3 both for simplicity and because it is not a part of the present invention. The supporting means 12 is sketched as a holder with ledges upon which peripheral areas of a wafer W are designed to rest. The drawing, however, is intended to be schematic and not representational. Numeral 14 indicates a vacuum duct connecting the load lock chamber 10 to a vacuum pump, and a nitrogen gas source 16 is connected to the duct 14 through a valve 18 and a filter 20 of a conventional type commonly used in a pneumatic system of this type. Numeral 22 generally indicates means for controlling the opening and closing of the valve 18 by an electric signal 19 and includes a computer 24. The computer 24 is so programmed as to initially output a pulse signal for causing the valve 18 to open such that an appropriate predetermined amount of nitrogen gas from the source 16 will flow through the duct 14 into the vacuum interior of the load lock chamber 10 so as to increase its interior pressure to a predetermined intermediate pressure level $P_d$ and to subsequently output another signal for completely venting the load lock chamber 10 after a predetermined dwell time $t_d$. A program for controlling the valve 18 in a desired manner as broadly described above can be produced by any person skilled in the art and hence is not described in detail. Experimentation with two variables (the length of pulse and the dwell time at the intermediate pressure) has shown that controlling the pulse time gives favorably consistent results in terms of the relationship between pressure and pulse duration. The control law is linear because mass flow is choked into the load lock chamber.

FIG. 4 shows another apparatus with which the method of the present invention can be practiced by hardware implementation. In the block diagram of FIG. 4, the components which are substantially identical to those already described above in connection with FIG. 3 are indicated by the same numerals. According to this hardware implementation, a series connection of two pneumatically controlled valves, respectively referred to as an upstream valve 30 and a downstream valve 32 and having a vent reservoir 34 therebetween, connects the duct 14 with the nitrogen gas source 16. The opening and closing of the valves 30 and 32 are controlled not electronically by software but pneumatically by means of a sequencer 40, of which the function is to open and close the valves 30 and 32 such that the pressure inside the load lock chamber 10 will increase in two steps as shown generally in FIG. 1, rather than in one step as shown in FIG. 2.

The sequencer 40 is essentially a pneumatic delay circuit, like an electronic delay circuit with transistors and capacitors. According to the embodiment shown in FIG. 4, the sequencer 40 includes a delay valve 42 (such as Model R343 produced by Clippard Instrument Laboratory, Inc.), a switch valve 44 (such as Clippard's Model R401) and a volume chamber 46 (such as Clippard's Model R821). Of the four terminals of the sequencer 40, two serve to connect a high-pressure (such as 60 psi) air source 38 respectively to the delay valve 42 and to the switch valve 44, the other two serving to connect the delay valve 42 to the downstream valve 32 and the switch valve 44 to the upstream valve 30, respectively. The switch valve 44 is so designed that, in the absence of pressure being applied to its piston (not shown), the high-pressure air from the source 38 passes therethrough to apply pressure on and to thereby open the upstream valve 30, causing the vent reservoir 34 to become filled with the vent gas (nitrogen gas according to the embodiment being described) from the source 16. The pipe between the delay valve 42 and the downstream valve 32 has a branch connecting to a high-pressure air source (which is shown also at 38 in FIG. 4 for convenience but may be a separate source) through a normally closed air pilot valve 36. The delay valve 42 is so designed that, while the air pilot valve 36 is closed and hence there is no pressure being applied on its piston (not shown), the high-pressure air from the source 38 passes therethrough to fill the volume chamber 46 and to apply pressure on the piston of the switch valve 44. This causes the air flow path through the switch valve 44 to be closed, and the upstream valve 30, in the absence of pressure being communicated through the switch valve 44, also closes.

While the air pilot valve 36 remains closed, there is no pressure being applied on the downstream valve 32, and this means that the downstream valve 32 remains closed, keeping the load lock chamber 10 in its vacuum condition. When the air pilot valve 36 is opened (at time $t_0$), say, by means of an electric signal 41, the high-pressure air, which passes therethrough, exerts pressure both on the downstream valve 32 and on the piston of the delay valve 42. The pressure applied on the downstream valve 32 causes it to open, allowing the limited amount of vent gas stored in the vent reservoir 34 to enter the load lock chamber 10 and thereby causing its interior pressure to increase to a predetermined intermediate level. In the meantime, the pressure applied on the piston of the delay valve 42 has the effect of closing the air path between the air source 38 and the volume chamber 46 while causing the air stored inside the volume chamber 46 to bleed off through the delay valve 42. When the pressure on the piston of the switch valve 44 drops to a certain threshold value, the piston is pushed back by a biasing force thereon so as to re-establish the pressure-communicating relationship between the high-pressure air source 38 and the upstream valve 30, thereby opening the upstream valve 30 and allowing the vent gas from its source 16 to flow into the load lock chamber 10 for complete venting after a delay as shown by the pressure profile in FIG. 1. The time of this delay is determined by the speed at which the air from the volume chamber 46 bleeds off. This bleed-off speed is controlled by a speed control valve 48 (such as Model JFC2 produced by Clippard Instrument Laboratory, Inc.) comprising a variable orifice.

After the load lock chamber 10 is fully vented, the air pilot valve 36 is closed again (say, at time $t_1$). This has the effect of closing the downstream valve 32, and the vent reservoir 34 is filled with the vent gas again. Concurrently, the air from the high-pressure source 38 passes through the delay valve 42 to fill the volume chamber 46 and applies pressure on the piston of the switch valve 44, thereby closing the upstream valve 30. In the meantime, the load lock chamber 10 is evacuated through the duct 14 for the next cycle of operations. FIG. 5 is a pressure diagram showing the pressure changes with time at the air pilot valve 36, the delay valve 42 and the switch valve 44. The invention has been described above by way of only a few examples of its embodiment. These examples, however, are intended to be illustrative and not limitative. The intermediate pressure level, for example, may be below 1 torr and as high as 50 torr, depending on circumstances and other factors. The holder for the heated object inside the load lock chamber need not be of a structure as sketched schematically in the drawings. In fact, it need not be of a type to hold a wafer horizontally. In summary, it is to be understood that such modifications and variations to the described embodiments that may be apparent to a person skilled in the art are intended to be within the scope of this invention.

What is claimed is:

1. A method of controlling thermal gradient, comprising the steps of:
   creating a vacuum condition inside an air-tight chamber containing a supporting means capable of conducting heat;
   placing a heated object on said supporting means inside said chamber;
   introducing a limited amount of vent gas into said chamber such that the interior of said chamber is maintained at an intermediate pressure level for a specified time period such that the thermal gradient within said object between contacting and non-contacting areas of said object with said supporting means is significantly reduced and would be less than if said chamber were fully vented in a single step; and
   thereafter introducing a large amount of vent gas into said chamber to bring the pressure inside said chamber to a predetermined final level which is higher than said intermediate pressure level.

2. The method of claim 1 wherein said vent gas is introduced into said chamber through a control valve, said control valve is opened by a signal outputted from a computer, and said computer is programmed to output signals to said control valve such that said limited amount of said vent gas is introduced into said chamber through said control valve and that said chamber is fully vented through said control valve after said specified period of time.

3. The method of claim 1 wherein said limited amount of vent gas is preliminarily stored inside a vent gas reservoir which is connected to said chamber through a control valve.

4. The method of claim 3 wherein said vent gas reservoir is connected to a vent gas source through an upstream valve such that said vent gas reservoir can be filled with said vent gas by opening said upstream valve, and wherein said upstream valve and said control valve are pneumatically controlled by a sequencer adapted to cause said control valve and said upstream valve to open according to a specified time sequence.

5. An apparatus for controlling thermal gradient in a heated object, said apparatus comprising
   an air-tight chamber wherein a vacuum condition can be established, said chamber containing a heat-conductive holder for supporting said heated object;
   a vent gas source;
   valve means for allowing and preventing the passage of a vent gas from said vent gas source into said chamber; and
   a valve control means for controlling said valve means, said valve control means being adapted to initially control said valve means so as to allow only a limited amount of said vent gas to flow into said chamber to thereby increase the pressure inside said chamber to a specified intermediate level and to subsequently control said valve means after a specified period of time so as to fully vent said chamber such that the pressure inside said chamber reaches a final level which is significantly higher than said intermediate level.

6. The apparatus of claim 5 wherein said intermediate level of pressure and said specified period of time are determined such that the thermal gradient within said object would be significantly less than if said chamber were vented in a single step initially.

7. The apparatus of claim 5 wherein said valve means include a downstream valve, a vent reservoir and an upstream valve, said downstream valve being connected between said chamber and said reservoir, said upstream valve being connected between said vent reservoir and said vent gas source, said vent reservoir containing a specified amount of said vent gas which, when introduced into said chamber through said downstream valve, increases the pressure inside said chamber to said specified intermediate level.

8. The apparatus of claim 7 wherein said valve control means include a pneumatic sequencer which serves to controllably direct a high-pressure control gas from a high-pressure gas source to said downstream and upstream valves so as to open said upstream valve with an adjustable delay after said downstream valve is opened.

9. The apparatus of claim 8 wherein said sequencer includes a switch valve which is biased to remain open so as to apply the pressure from said high-pressure gas source to said upstream valve, an air-tight gas container, and a delay valve which is normally open so as to apply the pressure from said high-pressure gas source applied through said air-tight gas container to said switch valve and to thereby close said switch valve, said delay valve serving, when in closed condition, to bleed off said control gas from said gas container.

10. The apparatus of claim 9 wherein said sequencer further includes a speed control means for controlling the speed at which said control gas is bled off from said gas container when said delay valve is closed.

11. The apparatus of claim 9 wherein said valve control means further include means for simultaneously closing said delay valve and opening said downstream valve.

12. The apparatus of claim 5 wherein said valve means include a control valve, and wherein said valve control means include a computer which is programmed to output control signals to said control valve and to thereby initially open said control valve to allow only said limited amount of vent gas to enter said chamber and to subsequently open said control valve after said specified period of time to fully vent said chamber.

13. A method of controlling the thermal gradient in a heated semiconductor wafer in a vacuum chamber which comprises
a) transferring said wafer onto a thermally conductive support in said vacuum chamber;
b) introducing a limited amount of vent gas into said chamber;
c) maintaining the pressure in the chamber of step b) for a time sufficient to reduce the temperature gradient in the wafer and;
d) introducing an additional amount of vent gas into the chamber.

14. A method according to claim 13 wherein said wafer is made of silicon.

15. A method according to claim 13 wherein said vent gas is nitrogen added in step b) so that the pressure in the chamber is no higher than 10 torr.

16. A method according to claim 13 wherein in step d) an amount of vent gas is added to the chamber to bring it to ambient pressure.

17. A method according to claim 13 wherein the initial temperature of the wafer is over about 300° C.

18. A method of reducing the rate of cooling of a silicon wafer where it is supported on a thermally conductive support in a vacuum chamber as it is vented which comprises a) introducing a limited amount of vent gas into said chamber; waiting elapse of a dwell time to allow heat to be more uniformly distributed across the wafer, thereby reducing the thermal gradient across the wafer; and adding additional vent gas.

19. A vacuum load lock chamber fitted with
a) a thermally conductive support for a heated semiconductor wafer,
b) a vent gas source,
c) valve means for allowing said vent gas into said chamber, and
d) valve control means for allowing a limited amount of said vent gas into said chamber so as to limit heat transfer in the wafer, allowing a predetermined time to elapse so that a temperature gradient in said wafer is reduced, and allowing additional vent gas into said chamber.

20. A load lock chamber according to claim 19 wherein said chamber is connected to a semiconductor processing chamber and wherein said load lock chamber is fitted with means of transferring a wafer from the processing chamber onto the support in the load lock chamber.

21. A load lock chamber according to claim 19 wherein said valve means includes a control valve and said valve control means includes a computer programmed to output control signals to said control valve to thereby initially open said control valve to allow only said limited amount of vent gas into said chamber, to allow a predetermined time period to elapse and to thereafter open said control valve to allow additional vent gas into said chamber.

22. A load lock chamber according to claim 19 wherein said valve means includes a downstream valve, a vent reservoir and an upstream valve, said downstream valve being connected between said chamber and said reservoir, said upstream valve being connected between said vent reservoir and said vent gas source, said vent reservoir containing a specified amount of said vent gas which, when introduced into said chamber through said downstream valve, increases the pressure inside said chamber to said specified intermediate level.

23. A load lock chamber according to claim 22 wherein said valve control means includes a pneumatic sequencer which serves to controllably direct a high-pressure control gas from a high-pressure gas source to said downstream and upstream valves so as to open said upstream valve with an adjustable delay after said downstream valve is opened.

24. A load lock chamber according to claim 23 wherein said sequencer includes a switch valve which is biased to remain open so as to apply the pressure from said high-pressure gas source to said upstream valve, an air-tight gas container, and a delay valve which is normally open so as to apply the pressure from said high-pressure gas source applied through said air-tight gas container to said switch valve and to thereby close said switch valve, said delay valve serving when in a closed condition, to bleed off said control gas from said gas container.

25. A load lock chamber according to claim 24 wherein said sequencer further includes a speed control means for controlling the speed at which said control gas is bled off from said gas container when said delay valve is closed.

26. A load lock chamber according to claim 24 wherein said valve control means further includes means for simultaneously closing said delay valve and opening said downstream valve.

* * * * *